United States Patent
Angiolini et al.

(10) Patent No.: US 11,675,942 B2
(45) Date of Patent: *Jun. 13, 2023

(54) OPTIMIZATION OF PARAMETERS FOR SYNTHESIS OF A TOPOLOGY USING A DISCRIMINANT FUNCTION MODULE

(71) Applicant: ARTERIS, INC., Campbell, CA (US)

(72) Inventors: Federico Angiolini, Lausanne (CH); Khaled Labib, San Jose, CA (US)

(73) Assignee: ARTERIS, INC., Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/683,361

(22) Filed: Mar. 1, 2022

(65) Prior Publication Data

US 2022/0222404 A1 Jul. 14, 2022

Related U.S. Application Data

(63) Continuation of application No. 17/134,380, filed on Dec. 26, 2020, now Pat. No. 11,281,827.

(51) Int. Cl.
*G06F 30/31* (2020.01)
*G06F 30/398* (2020.01)
(Continued)

(52) U.S. Cl.
CPC ............ *G06F 30/31* (2020.01); *G06F 30/327* (2020.01); *G06F 30/367* (2020.01); *G06F 30/398* (2020.01)

(58) Field of Classification Search
CPC ...................................................... G06F 30/31
(Continued)

(56) References Cited

U.S. PATENT DOCUMENTS

| 5,485,396 A | 1/1996 | Brasen et al. |
| 5,623,420 A | 4/1997 | Yee et al. |

(Continued)

FOREIGN PATENT DOCUMENTS

| CN | 105187313 B | 5/2018 |
| CN | 109587081 A | 4/2019 |

(Continued)

OTHER PUBLICATIONS

U.S. Appl. No. 17/134,384, filed Dec. 26, 2020, Federico Angiolini.

(Continued)

*Primary Examiner* — Eric D Lee
(74) *Attorney, Agent, or Firm* — Dana Legal Services; Jubin Dana (57) ABSTRACT

A tool is disclosed that includes a discriminant module. The discriminant module finds one configuration, which is selected from many different possible and legal configurations, that is optimal. The optimal configuration is translated into a set of optimized parameters (identified from the library of parameters that the user can select from) and provided to the designer. The designer reviews (and can manually revise or change) the optimized parameters. The optimized parameters are translated into engineering parameters. The engineering parameters are passed, as an input, to the RTL generation module. The RTL generation module produces the RTL description of the hardware function that is optimal and meets the designer's defined requirements.

7 Claims, 4 Drawing Sheets

(51) Int. Cl.
*G06F 30/367* (2020.01)
*G06F 30/327* (2020.01)

(58) Field of Classification Search
USPC ......................................................... 716/104
See application file for complete search history.

(56) References Cited

U.S. PATENT DOCUMENTS

| | | |
|---|---|---|
| 5,638,288 A | 6/1997 | Deeley |
| 5,761,078 A | 6/1998 | Fuller et al. |
| 5,903,886 A | 5/1999 | Heimlich et al. |
| 5,983,277 A | 11/1999 | Heile et al. |
| 6,002,857 A | 12/1999 | Ramachandran |
| 6,134,705 A | 10/2000 | Pedersen et al. |
| 6,145,117 A | 11/2000 | Eng |
| 6,249,902 B1 | 6/2001 | Igusa et al. |
| 6,321,363 B1 | 11/2001 | Huang et al. |
| 6,360,356 B1 | 3/2002 | Eng |
| 6,378,121 B2 | 4/2002 | Hiraga |
| 6,437,804 B1 | 8/2002 | Ibe et al. |
| 6,449,761 B1 | 9/2002 | Greidinger et al. |
| 6,622,225 B1 | 9/2003 | Kessler et al. |
| 6,883,455 B2 | 4/2005 | Maeda et al. |
| 6,907,591 B1 | 6/2005 | Teig et al. |
| 7,096,436 B2 | 8/2006 | Bednar et al. |
| 7,398,497 B2 | 7/2008 | Sato et al. |
| 7,587,687 B2 | 9/2009 | Watanabe et al. |
| 7,788,625 B1 | 8/2010 | Donlin et al. |
| 8,042,087 B2 | 10/2011 | Murali et al. |
| 8,302,041 B1 | 10/2012 | Chan et al. |
| 8,819,611 B2 | 8/2014 | Philip et al. |
| 9,184,998 B2 | 11/2015 | Xue |
| 9,444,702 B1 | 9/2016 | Raponi et al. |
| 9,569,574 B1 | 2/2017 | Khan et al. |
| 9,792,397 B1 | 10/2017 | Nagaraja |
| 9,825,779 B2 | 11/2017 | Ruymbeke et al. |
| 9,940,423 B2 | 4/2018 | Lescure |
| 10,068,047 B1 | 9/2018 | Finn |
| 10,282,502 B1 | 5/2019 | BShara et al. |
| 10,348,563 B2 | 7/2019 | Rao et al. |
| 10,460,062 B2 | 10/2019 | Feld et al. |
| 10,733,350 B1 | 8/2020 | Prasad et al. |
| 10,922,471 B2 | 2/2021 | Baeckler et al. |
| 10,990,724 B1 | 4/2021 | Cherif et al. |
| 11,121,933 B2 | 9/2021 | Cherif et al. |
| 11,281,827 B1 | 3/2022 | Labib et al. |
| 11,449,655 B2 | 9/2022 | Cherif et al. |
| 2003/0093765 A1 | 5/2003 | Lam et al. |
| 2004/0040007 A1 | 2/2004 | Harn |
| 2004/0230919 A1 | 11/2004 | Balasubramanian et al. |
| 2005/0073316 A1 | 4/2005 | Graham |
| 2005/0268258 A1 | 12/2005 | Decker |
| 2007/0156378 A1 | 7/2007 | McNamara |
| 2007/0157131 A1 | 7/2007 | Watanabe et al. |
| 2007/0174795 A1 | 7/2007 | Lavagno et al. |
| 2007/0186018 A1 | 8/2007 | Radulescu et al. |
| 2008/0046854 A1 | 2/2008 | Tang |
| 2008/0049753 A1 | 2/2008 | Heinze et al. |
| 2008/0279183 A1 | 11/2008 | Wiley et al. |
| 2008/0291826 A1 | 11/2008 | Licardie et al. |
| 2009/0031277 A1 | 1/2009 | Mcelvain et al. |
| 2009/0313592 A1 | 12/2009 | Murali et al. |
| 2010/0061352 A1 | 3/2010 | Fasolo et al. |
| 2010/0162189 A1 | 6/2010 | Lavagno et al. |
| 2010/0218146 A1 | 8/2010 | Platzker et al. |
| 2010/0274785 A1 | 10/2010 | Procopiuc et al. |
| 2011/0170406 A1 | 7/2011 | Krishnaswamy |
| 2012/0013509 A1 | 1/2012 | Wisherd et al. |
| 2012/0311512 A1 | 12/2012 | Michel et al. |
| 2013/0174113 A1 | 7/2013 | Lecler et al. |
| 2013/0258847 A1 | 10/2013 | Zhang et al. |
| 2013/0283226 A1 | 10/2013 | Ho et al. |
| 2014/0115218 A1 | 4/2014 | Philip et al. |
| 2014/0126572 A1 | 5/2014 | Hutton et al. |
| 2014/0153575 A1 | 6/2014 | Munoz |
| 2014/0160939 A1 | 6/2014 | Arad |
| 2014/0169173 A1 | 6/2014 | Naouri et al. |
| 2014/0211622 A1 | 7/2014 | Kumar et al. |
| 2014/0298281 A1 | 10/2014 | Varadarajan et al. |
| 2015/0036536 A1 | 2/2015 | Kumar et al. |
| 2015/0106778 A1 | 4/2015 | Mangano et al. |
| 2015/0178435 A1 | 6/2015 | Kumar |
| 2015/0254325 A1 | 9/2015 | Stringham |
| 2015/0341224 A1 | 11/2015 | Van et al. |
| 2015/0347641 A1 | 12/2015 | Gristede et al. |
| 2016/0103943 A1 | 4/2016 | Xia et al. |
| 2016/0275213 A1* | 9/2016 | Tomita .................. G06F 30/327 |
| 2017/0060204 A1 | 3/2017 | Gangwar et al. |
| 2017/0063734 A1 | 3/2017 | Kumar |
| 2017/0132350 A1 | 5/2017 | Janac |
| 2017/0177778 A1 | 6/2017 | Lescure |
| 2017/0193136 A1 | 7/2017 | Prasad et al. |
| 2018/0115487 A1 | 4/2018 | Thubert et al. |
| 2018/0144071 A1 | 5/2018 | Yu et al. |
| 2018/0227180 A1 | 8/2018 | Rao et al. |
| 2019/0073440 A1 | 3/2019 | Farbiz |
| 2019/0205493 A1 | 7/2019 | Garibay et al. |
| 2019/0246989 A1 | 8/2019 | Genov et al. |
| 2019/0251227 A1 | 8/2019 | Fink |
| 2019/0260504 A1 | 8/2019 | Philip et al. |
| 2019/0363789 A1 | 11/2019 | Lee et al. |
| 2020/0092230 A1 | 3/2020 | Schultz et al. |
| 2020/0162335 A1 | 5/2020 | Chen et al. |
| 2020/0234582 A1 | 7/2020 | Mintz |
| 2020/0366607 A1 | 11/2020 | Kommula et al. |
| 2021/0203557 A1 | 7/2021 | Cherif et al. |
| 2021/0320869 A1 | 10/2021 | Bourai et al. |
| 2021/0409284 A1 | 12/2021 | Cherif et al. |
| 2022/0294704 A1 | 9/2022 | Lescure et al. |

FOREIGN PATENT DOCUMENTS

| | | |
|---|---|---|
| CN | 113051215 A | 6/2021 |
| CN | 113055219 A | 6/2021 |
| DE | 102015014851 A1 | 5/2016 |
| EP | 3842987 A1 | 6/2021 |
| EP | 4024262 A1 | 7/2022 |
| EP | 4057179 A1 | 9/2022 |

OTHER PUBLICATIONS

U.S. Appl. No. 17/665,578, filed Feb. 6, 2022, K. Charles Janac.
"A distributed interleaving scheme for efficient access to wideIO dram memory", Seiculescu Ciprian, Benin! Luca, De Micheli Giovanni, CODES+ISSS'12 (Year: 2012).
"Thread-Fair Memory Request Reordering"; Kun Fang, Nick Iliev, Ehsan Noohi, Suyu Zhang, and Zhichun Zhu; Dept. of ECE, Univeristy of Illinois at Chicago; JWAC-3 Jun. 9, 2012.
19th Asia and South Pacific Design Automation Conference Alberto Ghiribaldi, Hervé Tatenguem Fankem, Federico Angiolini, Mikkel Stensgaard, Tobias Bjerregaard, Davide Bertozzi A Vertically Integrated and Interoperable Multi-Vendor Synthesis Flow for Predictable NoC Design in Nanoscale Technologies.
ACM ICCAD '06 Srinivasan Murali, Paolo Meloni, Federico Angiolini, David Atienza, Salvatore Carta, Luca Benini, Giovanni De Micheli, Luigi Raffo Designing Application-Specific Networks on Chips with Floorplan Information p. 8, Figure 8.
Alessandro Pinto et al, "System level design paradigms", ACM Transactions On Design Automation of Electronic Systems, ACM, New York, NY, US, (Jun. 7, 2004), vol. 11, No. 3, doi:10.1145/1142980.1142982, ISSN 1084-4309, pp. 537-563, XP058222500.
Annual IEEE International SoC Conference Proceedings Mohammad reza Kakoee, Federico Angiolin, Srinivasan Murali, Antonio Pullini, Ciprian Seiculescu, and Luca Benini A Floorplan-aware Interactive Tool Flow for NoC Design and Synthesis pp. 1, 2, 4 2009 Belfast, Northern Ireland, UK.
Bo Huang et al, "Application-Specific Network-on-Chip synthesis with topology-aware floorplanning", Integrated Circuits and Systems Design (SBCCI), 2012 25th Symposium On, IEEE, (Aug. 30, 2012), doi:10.1109/SBCCI.2012.6344421, ISBN 978-1-4673-2606-3, pp. 1-6, XP032471227.

(56) References Cited

OTHER PUBLICATIONS

David Atienza et al, Network-on-Chip Design and Synthesis Outlook, Science Direct, Integration the VLSI, journal 41 (2008) 340-359.

Jean-Jacques Lecler et al: Application driven network-on-chip architecture exploration & refinement for a complex SoC, Design Automation for Embedded Systems, vol. 15 No. 2, Apr. 7, 2011, DOI: 10.1007/S10617-011-9075-5.

K. R. Manik et al., "Methodology for Design of Optimum NOC Based on I PG," 2017 Int'l Conference on Algorithms, Methodology, Model and Applications in Emerging Technologies (ICAMMAET), Chennai, India, IEEE, 6 pages. (Year: 2017).

Luca Benini: "Application specific Noc design", Design, Automation and Test in Europe, 2006, Date '06 : Mar. 6-10, 2006, [Munich, Germany; Proceedings] / [Sponsored By the European Design and Automation Association], IEEE, Piscataway, NJ, USA, Mar. 6, 2006 (Mar. 6, 2006), pp. 491-495, XP058393584, ISBN: 9783981080100.

Partha et al., Design, Synthesis, and Test of Networks on Chips, IEEE (Year: 2005).

Srinivasan K et al, "Linear programming based techniques for synthesis of network-on-chip architectures", Computer Design: VLSI in Computers and Processors, 2004. ICCD 2004. Pr Oceedings. IEEE International Conference On San Jose, CA, USA Oct. 11-13, 2004, Piscataway, NJ, USA,IEEE, (Oct. 11, 2004), doi: 10.1109/ICCD.2004.1347957, ISBN 978-0-7695-2231-9, pp. 422-429, XP010736641.

Srinivasan Murali et al: "Mapping and physical planning of networks-on-chip architectures with quality-of-service guarantees", Proceedings of The 2005 Asia and South Pacific Design Automation Conference, Jan. 18, 2005, DOI: 10.1145/1120725.1120737.

Tobias Bjerregaard et al:"A Router Architecture for Connection-Oriented Service Guarantees in the MANGO Clockless Network-on-Chip", Proceedings of the IEEE Conference and Exhibition On Design, Automation, and Test in Europe, Mar. 7, 2005, DOI: 10.1109/DATE.2005.36.

Wei Zhong et al: "Floorplanning and Topology Synthesis for Application-Specific Network-on-Chips", IEICE Transactions On Fundamentals of Electronics< Communications and Computer Sciences, Jun. 1, 2013, DOI: 10.1587/TRANSFUN.E96.A.1174.

Zhou Rongrong et al: A Network Components Insertion Method for 3D Application-Specific Network-on-Chip, Proceedings of the 11th IEEE International Conference On Asic, Nov. 3, 2015, pp. 1-4, DOI: 10.1109/ASICON.2015.7516952.

Dumitriu Vet Al: "Throughput-Oriented Noc Topology Generation and Analysis for High Performance SoCs", IEEE Transactions On Very Large Scale Integration (VLSI) Systems, IEEE Service Center, Piscataway, NJ, USA, vol. 17, No. 10, Oct. 1, 2009 (Oct. 1, 2009), pp. 1433-1446, XP011267808, ISSN: 1063-8210, DOI: 10.1109/TVLSI.2008.2004592.

Fangfa Fu et al: "A Noc performance evaluation platform supporting designs at multiple levels of abstraction", Industrial Electronics and Applications, 2009. ICIEA 2009. 4th IEEE Conference On, IEEE, Piscataway, NJ, USA, May 25, 2009 (May 25, 2009), pp. 425-429, XP031482069, ISBN: 978-1-4244-2799-4 *abstract* * p. 426-p. 429 *.

Murali et al: "Synthesis of Predictable Networks-on-Chip-Based Interconnect Architectures for Chip Multiprocessors", IEEE Transactions On Very Large Scale Integration (VLSI) Systems, IEEE Service Center, Piscataway, NJ, USA, vol. 15, No. 8, Aug. 1, 2007 (Aug. 1, 2007), pp. 869-880, XP011187732, ISSN: 1063-8210, DOI: 10.1109/TVLSL2007.900742.

Picornell Tomas Tompic@Gap.Upv.Es et al: "DCFNoC A Delayed Conflict-Free Time Division Multiplexing Network on Chip", Designing Interactive Systems Conference, ACM, 2 Penn Plaza, Suite 701 New York NY10121-0701 USA, Jun. 2, 2019 (Jun. 2, 2019), pp. 1-6, XP058637807, DOI: 10.1145/3316781.3317794 ISBN: 978-1-4503-5850-7.

Francesco Robino: "A model-based design approach for heterogeneous NoC-based MPSoCs on FPGA", Jul. 1, 2014 (Jul. 1, 2014), XP002806918, Retrieved from the Internet: URL: http://www.divaportal.org/smash/get/diva2:718518/FULLTEXT02.pdf [retrieved on Jun. 22, 2022].

* cited by examiner

OPTIMIZATION OF PARAMETERS FOR SYNTHESIS OF A TOPOLOGY USING A DISCRIMINANT FUNCTION MODULE

CROSS REFERENCE TO RELATED APPLICATION

This application is a continuation of U.S. Non-Provisional application Ser. No. 17/134,380 filed on Dec. 26, 2020 and tiled OPTIMIZATION OF PARAMETERS FOR SYNTHESIS OF A TOPOLOGY USING A DISCRIMINANT FUNCTION MODULE by Federico ANGIOLINI et al, the entire disclosure of which is incorporated herein by reference.

FIELD OF THE INVENTION

The present technology is in the field of system design and, more specifically, related to automatic selection of optimal parameter that are provided as an input to a Register Transfer Level (RTL) module that generates an RTL hardware description.

BACKGROUND

In the context of integrated circuit (IC) design work, processes are used that generate a Register Transfer Level (RTL) description of a hardware function. The hardware function can be very complex and composed of multiple sub-functions. The generated hardware functions can be used in representations of an integrated circuit. The integrated circuit is built from RTL descriptions of hardware functions using standard ASIC implementation flow and tools such as logic synthesis, place and route, and so on. Hardware functions can be developed as fixed function elements or be made configurable so that they address many different needs and be reused into many different chips. This invention applies to the latter case.

When the configurability of the hardware function is very high, such as in a configurable network-on-chip (NoC) design, designers use a module that will generate the hardware function, based on configuration information. The module takes configuration information as input and processes the input to decide what hardware needs to be generated as an RTL description. The configuration information can be in any format. The configuration information, in general, is a set of parameters. Therefore, the module takes a set of parameters and produces different RTL descriptions for different hardware functions. One example is a hardware function that performs the addition of two integers. An RTL description of that adder can be generated based on a set of parameters for the adder. A set of parameters includes how many bits the input and the output of the adder need to have. This parameter is designated as Data Width (DW) bits and has a value. In typical RTL generation, the module will take as input the value of DW and produces an RTL description of an adder that is DW bits wide. Each parameter needs to obey to some rules regarding the values that parameter can take. These rules may specify limits to the value of the parameter and possibly relationships between parameters.

A complete set of parameter values that uniquely configures the intellectual property block and meets all rules that each parameter must obey is called a legal, or legalized, configuration. As such, when the number of parameters, which are considered, becomes large, the combinations of different parameters can become extremely large. Therefore, the set of all legal configurations can also become extremely large.

Each legal configuration can be used to generate an RTL description of a hardware function. Once implemented on an IC, using standard ASIC implementation flow, the hardware function will have a certain size (area) and certain timing characteristics (for example, how fast can it work). Typically, a designer of an IC wants to optimize both the area and the timing of the generated circuit. The designer might also want to optimize other metrics such as power consumption, and so on. If the set of legal configurations is extremely large, and more than one legal configuration can lead to generation of a hardware function that performs the needed tasks, it becomes very difficult for the designer to find the best legal configuration that will give the RTL description of the hardware function that best optimizes the various metrics that the designer needs. Therefore, what is needed is a system and method that can automatically find the best legal configuration that will optimize a given set of metrics, such as area, timing, power and so on.

SUMMARY OF THE INVENTION

In accordance with various embodiments and aspects of the invention, systems and methods are disclosed that can automatically find the best legal configuration that will be optimal with respect to a given set of requirements or metrics, such as: area, timing, and power. A designer defines the metrics or requirements, which represent the functional needs. A designer typically selects a set of parameters from a group of parameters available to user, which are user selectable parameters. In accordance with the various aspects of the invention, the best parameters, from which the user can select parameters, are identified, and provided to the user. A constraint solver module ensures all rules are enforced and finds all legal parameters that fulfil the user intent. The constraint solver module generates configurations that meet the requirements and are legal configurations. A discriminant function module finds one configuration, which is selected from the configurations, that is optimal. In optimization problems, optimality is a function of time and space. The more time that is given to an algorithm to find a better solution and the larger the solution domain space, the better a solution may be found. Thus, there are local minima/maxima and a global minima/maxima. Both could be called optimal but with different scopes. The optimal configuration is translated into a set of optimized parameters (identified from the library of parameters that the user can select from) and provided to the designer. The designer review and manually revise or change the optimized parameters. The optimized parameters are translated into engineering parameters. The engineering parameters are passed, as an input, to the RTL generation module. The RTL generation module produces the RTL description of the hardware function that is optimal and meets the designer's defined requirements.

BRIEF DESCRIPTION OF THE DRAWINGS

In order to understand the invention more fully, reference is made to the accompanying drawings. The invention is described in accordance with the aspects and embodiments in the following description with reference to the drawings or figures (FIG.), in which like numbers represent the same or similar elements. Understanding that these drawings are not to be considered limitations in the scope of the invention, the presently described aspects and embodiments and the presently understood best mode of the invention are described with additional detail through use of the accompanying drawings.

DETAILED DESCRIPTION

The following describes various examples of the present technology that illustrate various aspects and embodiments of the invention. Generally, examples can use the described aspects in any combination. All statements herein reciting principles, aspects, and embodiments as well as specific examples thereof, are intended to encompass both structural and functional equivalents thereof. The examples provided are intended as non-limiting examples. Additionally, it is intended that such equivalents include both currently known equivalents and equivalents developed in the future, i.e., any elements developed that perform the same function, regardless of structure.

It is noted that, as used herein, the singular forms "a," "an" and "the" include plural referents unless the context clearly dictates otherwise. Reference throughout this specification to "one embodiment," "an embodiment," "certain embodiment," "various embodiments," or similar language means that a particular aspect, feature, structure, or characteristic described in connection with the embodiment is included in at least one embodiment of the invention.

Thus, appearances of the phrases "in one embodiment," "in at least one embodiment," "in an embodiment," "in certain embodiments," and similar language throughout this specification may, but do not necessarily, all refer to the same embodiment or similar embodiments. Furthermore, aspects and embodiments of the invention described herein are merely exemplary, and should not be construed as limiting of the scope or spirit of the invention as appreciated by those of ordinary skill in the art. The disclosed invention is effectively made or used in any embodiment that includes any novel aspect described herein. All statements herein reciting principles, aspects, and embodiments of the invention are intended to encompass both structural and functional equivalents thereof. It is intended that such equivalents include both currently known equivalents and equivalents developed in the future. Furthermore, to the extent that the terms "including", "includes", "having", "has", "with", or variants thereof are used in either the detailed description and the claims, such terms are intended to be inclusive in a similar manner to the term "comprising."

The terms "source," "master," and "initiator" refer to similar intellectual property (IP) modules/blocks or units; these terms are used interchangeably within the scope and embodiments of the invention. As used herein, the terms "sink," "slave," and "target" refer to similar IP modules or units and the terms are used interchangeably within the scope and embodiments of the invention. As used herein, a transaction may be a request transaction or a response transaction. Examples of request transactions include write request and read request.

Various references are made herein to integrated circuits (ICs) and the designs of ICs. One example of an IC is a multiprocessor system that is implemented in systems-on-chip (SoCs) that communicates through networks-on-chip (NoCs). The SoCs include instances of initiator intellectual properties (IPs) and target IPs. Transactions are sent from an initiator to one or more targets using industry-standard protocols. The initiator, connected to the NoC, sends a request transaction to a target or targets, using an address to select the target or targets. The NoC decodes the address and transports the request from the initiator to the target. The target handles the transaction and sends a response transaction, which is transported back by the NoC to the initiator. As such, the SoC and NoC include complexity and configurability, especially in situation when the NoC is configurable.

In accordance with various embodiments and aspects of the invention, a NoC description is generated using a synthesis tool during the design process. The tool generates a NoC from a set of constraints or parameters. In accordance with one aspect and embodiment of the invention, the NoC is configurable to the user/designer needs. If changes are made, then the tool will have to be restarted and re-executed. Accordingly, every time the input constraints change, the tool may need to restart or the synthesis is re-executed. For example, which is a non-limiting example, the system can deploy a process that can be run incrementally. In other words first set of constraints generate an initial solution. Then a second set of constraints, which differ from the first set of constraints by some value (X), plus the initial solution generate a second solution, which differs from the initial solution by value (Y). As such, if X small, then ideally Y is small as well.

As such, there is a risk of giving a completely different solution from one run to the next, even if the changes to the constraints are limited or minor. This is due to the nature of the network synthesis process, which typically uses a constraint approach to minimizing metrics, and the constraint solver module may find very different solutions in response to slightly different set of constraints. As such, the tool may find a different solution every time it runs for slightly different constraints. Thus, the tool has a reduced usability when used by a SoC designer to automatically create the NoC. During the design time of SoC, the constraints change and evolve. If the tool generates substantially different results each time the module runs and every time the user makes a small change, then this will lead to the designer being unable to reuse some of the implementation work already done.

For example, consider the situation when the NoC has already been generated from a set of constraints. The result has been processed through the ASIC design flow with logic synthesis and place and route steps done. The steps typically take a lot of time, e.g. multiple days. After this first generation, it is decided to remove a component from the SoC, which result in slight modification of the floorplan and the connectivity. The tool generating the NoC is run again with the updated constraints. The tool gives a completely different result compared to the first run. As such, all the previous work on logic synthesis and place and route needs to be done again from scratch, even if the constraint change was very small. This is very costly for the project.

Accordingly, there is a need for a tool that ensures, across two different runs using two sets of constraints with minor differences, minimum changes to the solution, which is needed to adapt to the changed constraints. Therefore, what is needed is a method to allow the tool to generate a NoC from a set of constraints while producing consistent results between runs that have slightly different/varying constraints, with the goal of minimizing the differences between the current run result and the previous run result.

Figure 1:
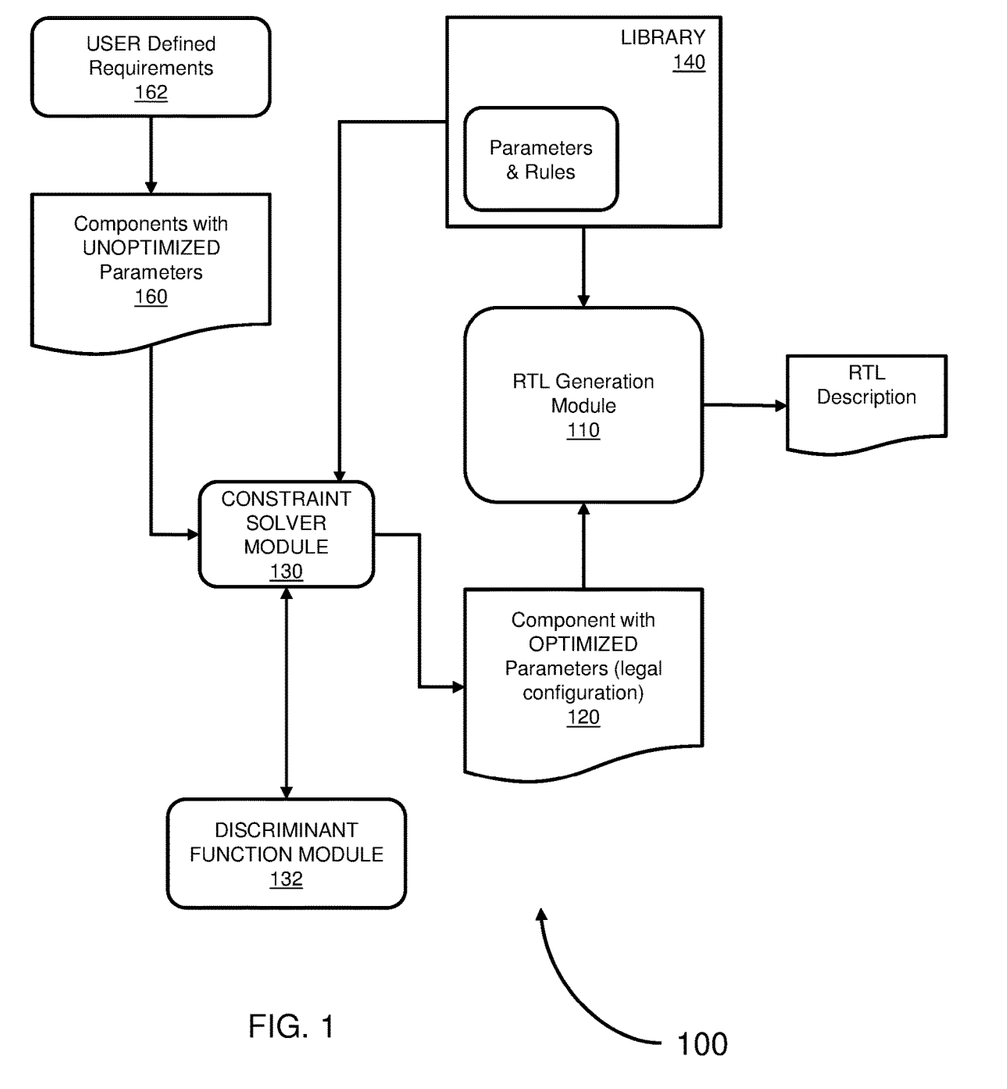
FIG. 1 shows a system in accordance with the various aspects and embodiments of the invention.

Referring now to FIG. 1, a process is shown for automatically generating a Register Transfer Level (RTL) description of a hardware function using an RTL generation module 110. In order to more clearly understand the invention and the various aspects, FIG. 2A, FIG. 2B, and FIG. 3 are discussed initially.

Figure 2A:
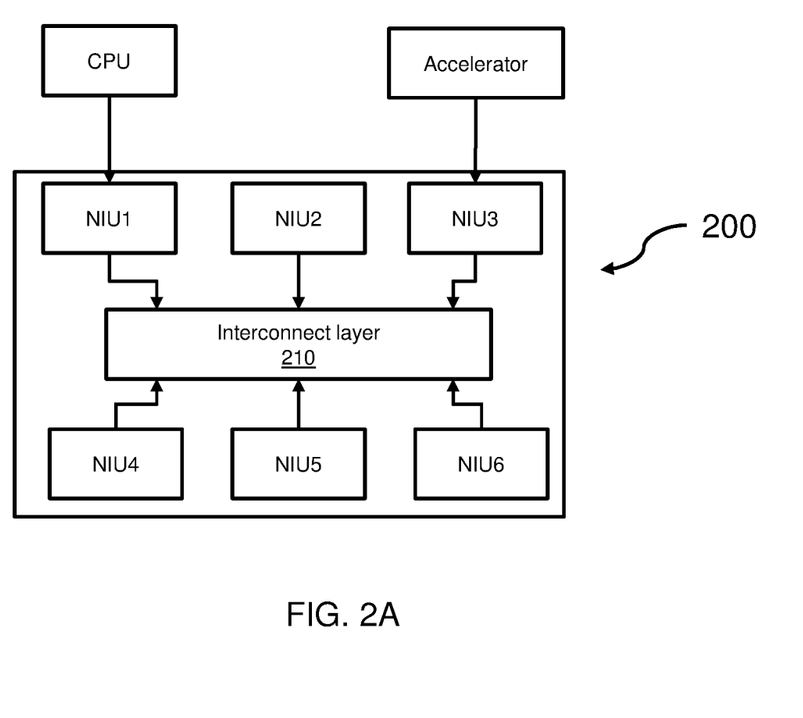
FIG. 2A shows a 3×3 implementation requirement, for which the system of FIG. 1 automatically generates user selectable parameters in accordance with the various aspects and embodiments of the invention.
Figure 2B:
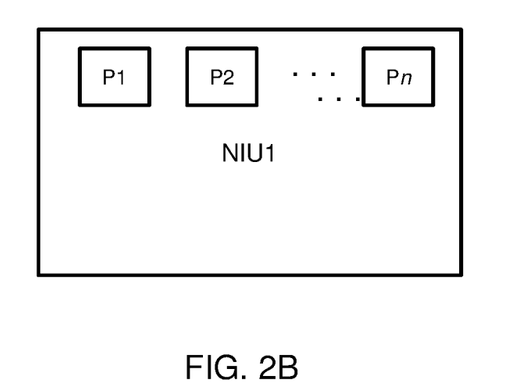
FIG. 2B shows an interface unit used in FIG. 2A, for which user selectable parameters are automatically generated in accordance with various aspects and embodiments of the invention.

Referring now to FIG. 2A and FIG. 2B, a system 200 is shown with an interconnect 210 that is the fabric that connects various intellectual property (IP) blocks to each other through various network interface units (NIUs), which are connected to the interconnect 210 in accordance with various aspect and embodiments of the invention. In the non-limiting example of the system 200, there are six NIU shown: NIU1, NIU2, and NIU3 are connected to initiators; and NIU4, NIU5, and NIU6 are connected to targets. The user can define the number of connections and IP blocks and the scope of the invention is not limited thereby. The user can define another IP Block, such as an accelerator IP block that is connected to NIU3. The user can define that the accelerator IP block is connected to NIU3, using an Advanced eXtensible Interface (AXI). In accordance with some aspect and embodiment of the invention, the user can elect to connect a CPU to any target using the NIU1's connection to the interconnect 210. The user can define that the CPU is connected to NIU1, which is a Coherent Hub Interface (CHI). All of the NIUs are configurable based on the user's needs. As such, the user can select and identify any set of parameters for the NIU in order to support the IP block connected thereto. For example, the NIU1 is connected to the CPU (IP block). The NIU1 has parameters P1, P2, ... Pn. These are the parameters that the user can select to define the connection between the CPU and other targets and the interconnect 210. These parameter define a set of legal rules and constraints that the design implementation must follow. Each of these parameters are related to other parameters. The user will have to set or select parameters for each IP block and the network. For simplicity, only the one example is discussed.

Figure 3:
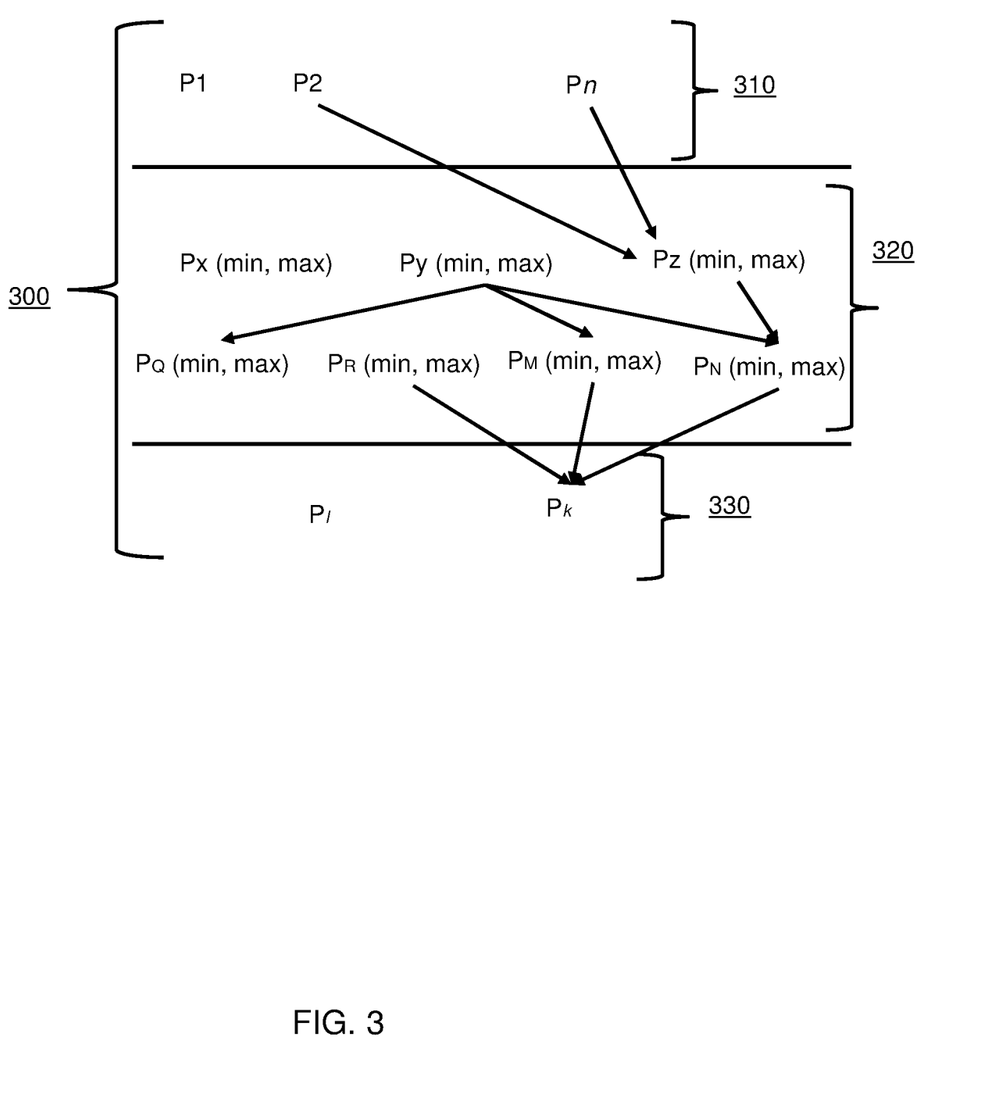
FIG. 3 shows a sample dependency graph in accordance with various aspects of the invention.

Referring now to FIG. 3, a dependency graph 300 for the various parameters is shown in accordance with various aspects and embodiments of the invention. The graph 300 is a highly connected and highly dimensional dependency graph. The graph 300 shows the various layers of parameters into which the parameter are separated. The graph 300 shows the dependencies of the parameters between layers. The graph 300 shows the relation of the parameters within a layer. The graph 300 connects the layers of parameters and the cross relationships within the same layer. The connection between different parameters in different layers is represented by functions, as outlined below. The graph 300, with its associated functions, ensures that all rules are being honored for each parameter at a layer.

The layers includes: a layer having a set of user selectable or settable user parameters 310, a layer having a set of engineering parameters 320, and a layer having a set of hardware parameters 330. The user settable parameters 310 include $P_1, P_2 \ldots P_n$, which are all visible to the user. The user parameters 310 are selectable or settable by the user through a graphical user interface (GUI) or a scripting interface, for example using the Tool Command Languages (TCL) language, to allow the user to define the user intent. Examples of the user's intent include and may be related to: address bus width, data bus width, buffer size, the area, the latency, or the power. Based on the user providing the user's intent, the process can automatically identify the user parameters 310 that need to be selected; these user parameters 310 will optimize the input to the RTL description generator, as discussed herein.

The parameters 320 are engineering parameters that are private parameters not visible to the user. The parameters 320 include, for a non-limiting example, the set of parameters $P_X$, $P_Y$, $P_Z$, $P_Q$, $P_R$, $P_M$, and $P_N$. The parameters 320 have a dependency relationship to the parameters 310 and well as to other parameters 320, as outlined in the graph 300. The parameters 320 can also have a value range (min, max) that must be honored for the configuration to be legal. This is an example of many possible ways the parameter values can be constrained. In other cases, parameters may be annotated with an explicit enumeration of legal values, for example, the first 8 powers of 2, or other similar mathematical relationships. In accordance with the various aspects and embodiments of the invention, $P_Z$ has a dependency relationship to P2 and Pn, in other words, Pz can be uniquely derived from their values. Pz includes a range of values (min, max). There are numerous other dependencies possible between parameters 310 and parameters 320, which are not shown for clarity of discussion and are contemplated within the scope of the invention.

In accordance with various aspects of the invention, $P_Y$, has a dependency relation to other parameters 320, such as $P_R$, $P_M$, and $P_N$. Parameter $P_k$ of the parameters 330 has a dependency on parameters $P_R$, $P_M$, and $P_N$ of group 320. The dependencies in the graph 300 are usually expressed as a function. For example, the dependency function for $P_k$ is written as follows:

$P_k$ ($P_R$, $P_M$, $P_N$) which can be written as:
$P_k$ ($P_R$, $P_Y$, $P_Y$, $P_Z$) based on the graph 300.

Referring now to FIG. 1, a system 100 is shown that implements a process to automatically generate the RTL description based on a set of user defined parameters (such as user parameters 310 of FIG. 3) and constraints that identify a designer's (user's) intent. In accordance with the various aspects of the invention, the system 100 will generate multiple random constrained RTL descriptions, each of which meet the designer's intent (parameters, rules, and constraints). In accordance with the various aspects of the invention, the system 100 uses machine learning to reduce the time needed to generate the multiple constrained random RTL descriptions, for example, by quickly discarding illegal parameter combinations. Further, neural network and machine learning can be used to train a model to generate the multiple constrained random RTL descriptions more efficiently. In accordance with the various aspects of the invention, the system 100 linearizes the non-linear relationships (e.g. logarithm relationship) between parameters at the various levels, an example of which is shown in the graph 300 of FIG. 3. The system 100 represents the non-linear relationships between the parameters, as shown in the graph 300, in a linear manner or as a combination of linear functions.

The process automatically provides an optimized and legal design by identification of a set of user parameters from selectable user parameters. The system 100 receives user defined requirements 162. From the user defined requirements, the system 100 automatically identifies the user parameters 310 (of FIG. 3) that the user needs to select in order for an RTL generation module 110 to generate the hardware description that meets the user's intent and defined requirements. The user parameters 310 (of FIG. 3) that are identified by the system 100 using the process will produce an optimized RTL description when executed by the RTL generation module 110. The resulting RTL description will be legal and will honor the intent (parameters, rules, and constraints) defined by the designer.

The process includes the constraint solver module 130 receiving information from a library 140. The library 140 provides element parameters, element descriptions, and rules to the constraint solver module 130 and to the RTL generation module 110. The library 140 provides information about elements and parameters 310 (and the related rules) to a constraint solver module 130. In accordance with the various aspects and embodiment of the invention and as a non-limiting example, parameters 310 and rules for a network (such as a NoC) include, but is not limited to: physical information about a floorplan; clock domain definition; power domain definition; initiator definition; target definition; data width; path width; connectivity between initiators and targets; and traffic class definition. The constraint solver module 130 receives from a library 140 all of the possible user parameters and rules. The constraint solver module 130 generates a typically-large number of possible hardware descriptions, for example thousands of them, using the parameters and rules from the library 140.

The designer uses an interface to indicate or provide information about what constraints the designer wants, which is the designer's intent or defined requirement 162. Examples have been provided through this disclosure of different types of user requirements or user intent. In accordance with some aspect of the invention, the user's intent are a specific or defined set of components related to an IP block and related to connecting the IP block to a network, such as connecting a CPU to NIU1 as shown in FIG. 3. This is how the designer set forth the intended functionality. The designer is seeking to select parameters (parameter 310 of FIG. 3) that implement the intended functionality. The system 100 takes the intended functionality to automatically help the designer to identify and select the correct parameters (of the parameters 310 available to the designer). In other words, the process analyzes the intended functionality to automatically derive and suggest user selectable parameters (parameters 310 of FIG. 3) to implement the intended functionality.

The constraint solver module 130 receives the indicated inputs and generates the numerous constrained random hardware descriptions using various combination of the intended parameters, which are a subset of the total number of the user selectable parameters, such as parameters 310. Each possible hardware description, which the constraints solver module 130 generates, is legal. The constraint solver module 130 uses he parameters 160 (the user parameters 310) and automatically provides a group of possible hardware designs, from which the best or optimal design can be identified by the discriminant function module 132.

The set of hardware descriptions, which are randomly generated by the constraint solver module 130, are related to the parameters 160 (the user parameters 310). In other words, the hardware descriptions are randomly generated and derived from the interdependences of the parameters 160 (user selectable parameters 310) with the hardware parameters 330 (as well as the engineering parameters 320) of FIG. 3. The constraint solver module 130 generates all of the possible hardware parameters 330 that represent the different hardware designs, which are legal and are unoptimized; these are provided to the discriminant function module 132. For example, in a 3×3 intended functionality, as shown in FIG. 2A, the designer defines an intent (parameter) for the 3×3 design.

The process uses the generated set of hardware descriptions (from the constraint solver module 130) as input to the discriminant function module 132. The discriminant function module 132 optimizes by selecting the best hardware description, which satisfies the intended functionality, from one of the numerous randomly generated hardware designs. The discriminant function module 132 provides the selected (best) hardware design to the constraint solver module 130. The constraint solver module 130 receives the selected (best) hardware design, which is the optimal or optimized hardware design. In accordance with the some aspects and embodiments of the invention, the discriminant function module 132 selects one of the generated set of hardware description and presents it to the user. The constraint solver module 130 can then determine the user parameters (parameters 310) that are needed to produce the selected (best) hardware design, which is the optimized design, through the dependency graph 300 and the related functions. According to the various aspects and embodiments of the invention, the constraint solver module 130 generates random (valid) parameter configurations and processes the generated random (valid) parameter using the derivations in graph 300. According to some aspects of the invention, processing the random (valid) parameter is performed using any logic and the scope of the invention is not limited by the type or complexity/simplicity of the logic. The selected (best) hardware design is the optimized design that corresponds to optimized parameters 120.

In accordance with the various aspects and embodiment of the invention, the process uses a discriminant function module 132 to select the most optimal design based on the user's defined intent, such a power or latency or area. The constraint solver module 130 takes the user's intent or defined requirements 162 and randomly generates thousands of hardware descriptions, from which the discriminant function module 132 finds one (the optimal) legal configuration that best conforms to the defined requirement and function intended by the user. The constraint solver module 130 helps the designer by automatically finding most, if not all, possible solutions that are legal combinations of parameter. In accordance with some aspects and embodiments of the invention, the constraint solver module 130 pre-selects solutions that are legal AND already incorporate a general bias towards efficient combinations of parameters. The pre-selection process may be aided by a trained artificial intelligent model.

The discriminant function module 132 identifies the optimal design from the possible solutions. The constraint solver module 130 takes the optimal design and uses the dependency graph to identify the selectable user parameters (parameters 310 of FIG. 3) that will results in an optimized hardware design derived from the optimized parameters 120. The optimized parameters 120 are provided to the RTL generation module 110. The RTL generation module 110 generates the RTL description using the optimized parameters 120 (selected from the set of user parameters 310). The resulting hardware design is legal and optimized with respect to the designer's intended functionality.

In accordance with the various aspects and embodiments of the invention, the constraint solver module 130 produces an output 120 that includes components with optimized parameters according to certain metrics. The constraint solver module 130 uses a discriminant function module 132 to optimize the input 160. The metrics to optimize the input 160 are described by the discriminant function module 132. The discriminant function module 132 returns a cost indication for each legal configuration returned by the constraint solver module 130.

The constraint solver module 130 ensures all rules governing the parameters are enforced. The constraint solver module 130 finds a legal configuration that fulfils the user intent defined by the requirements 162 (and related to parameters 160). The constraint solver module 130 minimizes the cost returned by the discriminant function module 132. which is associated with the configuration defined by or derived based on the parameters 160. The constraint solver module 130 provides, as an output, the optimized parameters 120. The optimized parameters 120 are used by the RTL generation module 110 to produce the RTL hardware description, which is a legal configuration for the designer's intended functionality. The RTL generation module 110 creates different components that make up the RTL description of the hardware function.

Figure 4:
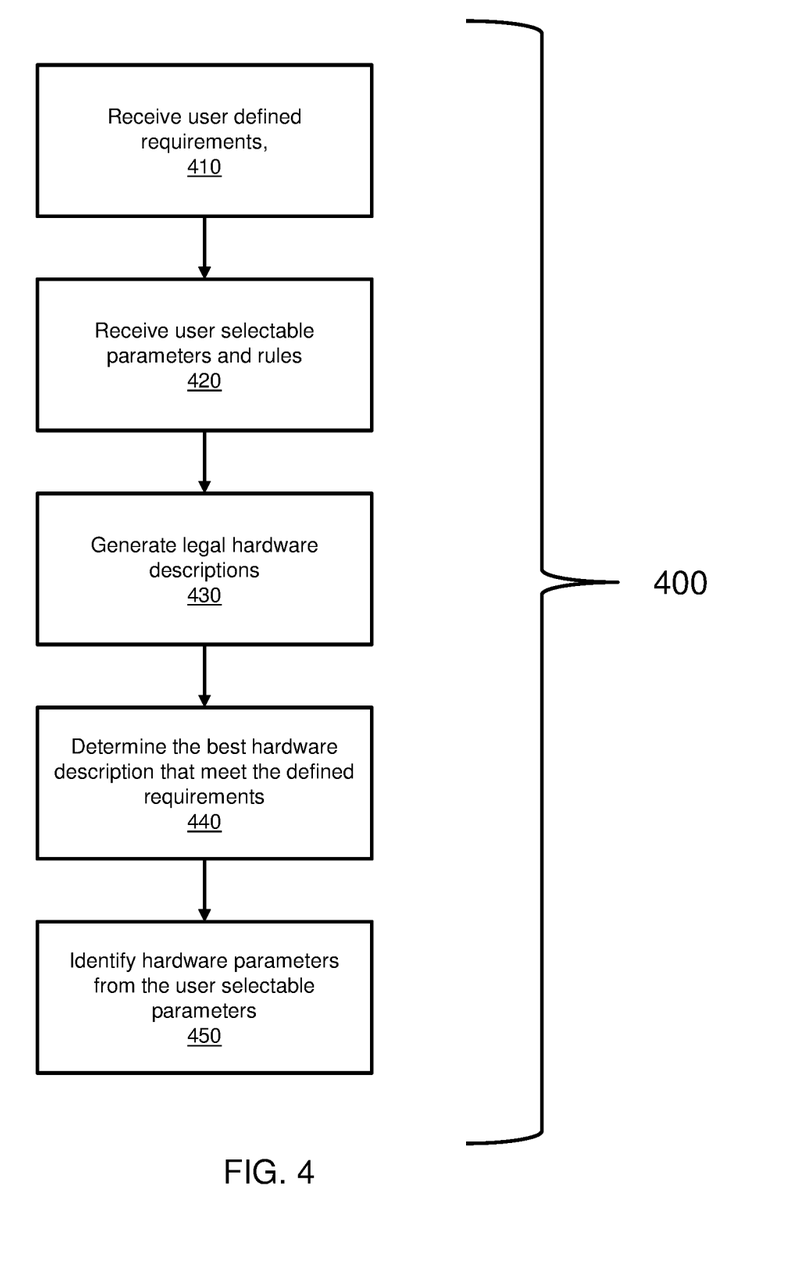
FIG. 4 shows a process flow, which is for the system of FIG. 1, in accordance with the various aspects of the invention.

Referring now to FIG. 4, a process 400 that is performed by the system 100 (FIG. 1) is shown in accordance with various aspects and embodiments of the invention. At step 410, the designer defines requirements for the intended design as an input to the system. More specifically, the designer inputs the defined requirements, which are provided to a constraint solver module of the system. The user defined requirements are related to a set of parameters. At step 420, a library provides a set of possible parameters, which are related to the defined requirements, to the constraint solver module. More specifically, the parameters provided to the constraint solver module are based on the user defined requirements. At step 430, the system generates a set of random hardware descriptions based on the possible parameters hardware. The set of random hardware descriptions are legal; the set may or may not be optimized. Each of the random hardware descriptions are generated from a set of hardware parameters that relate to a set of engineering parameters, which in turn are related to a set of user selectable parameters. The system uses a dependency graph and linear functions to determine the relation between hardware parameters and the user selectable parameters. At step 440, the constraint solver module provides the unoptimized parameters with the defined requirements to a discriminant function module. At step 450, the discriminant function module analyzes the information and selects the best user parameters (relatable to hardware parameters) that satisfy the defined requirements. The hardware parameters are related to the user parameters as defined by the dependency graph. The process can automatically identify the user parameters, which satisfy the defined requirements.

Certain methods according to the various aspects of the invention may be performed by instructions that are stored upon a non-transitory computer readable medium, for example a module. The non-transitory computer readable medium stores code including instructions that, if executed by one or more processors, would cause a system or computer to perform steps of the method described herein, including methods performed by a module, such as the modules described herein. The non-transitory computer readable medium includes: a rotating magnetic disk, a rotating optical disk, a flash random access memory (RAM) chip, and other mechanically moving or solid-state storage media.

Any type of computer-readable medium is appropriate for storing code comprising instructions according to various example. Some examples are one or more non-transitory computer readable media arranged to store such instructions for methods described herein. Additionally, modules may be represented by codes stored in non-transitory media or represented by hardware components that performs a specific function. Whatever machine holds non-transitory computer readable media comprising any of the necessary code may implement an example. Some examples may be implemented as: physical devices such as semiconductor chips; hardware description language representations of the logical or functional behavior of such devices; and one or more non-transitory computer readable media arranged to store such hardware description language representations.

Descriptions herein reciting principles, aspects, and embodiments encompass both structural and functional equivalents thereof. Elements described herein as coupled have an effectual relationship realizable by a direct connection or indirectly with one or more other intervening elements.

Certain examples have been described herein and it will be noted that different combinations of different components from different examples may be possible. Salient features are presented to better explain examples; however, it is clear that certain features may be added, modified and/or omitted without modifying the functional aspects of these examples as described.

Various examples are methods that use the behavior of either or a combination of machines. Method examples are complete wherever in the world most constituent steps occur. For example and in accordance with the various aspects and embodiments of the invention, IP elements or units include: processors (e.g., CPUs or GPUs), random-access memory (RAM—e.g., off-chip dynamic RAM or DRAM), a network interface for wired or wireless connections such as ethernet, Wi-Fi, 3G, 4G long-term evolution (LTE), 5G, and other wireless interface standard radios. The IP may also include various I/O interface devices, as needed for different peripheral devices such as touch screen sensors, geolocation receivers, microphones, speakers, Bluetooth peripherals, and USB devices, such as keyboards and mice, among others. By executing instructions stored in RAM devices processors perform steps of methods as described herein.

Practitioners skilled in the art will recognize many modifications and variations. The modifications and variations include any relevant combination of the disclosed features. Descriptions herein reciting principles, aspects, and embodiments encompass both structural and functional equivalents thereof. Elements described herein as "coupled" or "communicatively coupled" have an effectual relationship realizable by a direct connection or indirect connection, which uses one or more other intervening elements. Embodiments described herein as "communicating" or "in communication with" another device, module, or elements include any form of communication or link and include an effectual relationship. For example, a communication link may be established using a wired connection, wireless protocols, near-filed protocols, or RFID.

The scope of the invention, therefore, is not intended to be limited to the exemplary embodiments shown and described herein. Rather, the scope and spirit of present invention is embodied by the appended claims.

What is claimed is:

1. A method for automatically generating optimized parameters for synthesis of a network, the method comprising the steps of:

receiving, at a discriminant module, a plurality of unoptimized parameters, a plurality of element parameters, and a plurality of rules, wherein the unoptimized parameters are related to a plurality of user defined requirements for a topology and the discriminant module uses linear functions to determine a relationship between hardware parameters and user selectable parameters;

determining a set of optimal parameters that are optimized based on the user defined requirements and the plurality of unoptimized parameters, wherein the set of optimal parameters are legal parameters that meet the user defined requirements and are used to generate an RTL description.

2. The method of claim 1 further comprising identifying a set of user selectable parameters based on the set of optimal parameters.

3. The method of claim 2 further comprising selecting the set of user selectable parameters.

4. A system comprising:
  memory for storing a set of user defined requirements and code;
  a processor in communication with the memory, wherein the processor is capable of executing the code; and
  a discriminant module in communication with the memory and the processor, wherein when the processor executes code and causes the module to:
    receive, from a constraint solver module, a plurality of unoptimized parameters derived from the set of user defined requirements, wherein the discriminant module uses linear functions to determine a relationship between hardware parameters and user selectable parameters, and
    determine a set of optimal parameters that are optimized based on the user defined requirements and the plurality of unoptimized parameters,
  wherein the set of optimal parameters are legal parameters that meet the user defined requirements and are used to generate an RTL description.

5. The system of claim 4 further comprising a constraint module in communication with the discriminant module for analyzing the unoptimized parameters.

6. The system of claim 5, wherein the constraint module uses a dependency graph to determine relationships between the set of optimal parameters and engineering parameters.

7. The system of claim 6, wherein the dependency graph includes relationships between engineering parameters and hardware parameters.

* * * * *